United States Patent
Chen

(10) Patent No.: US 6,998,681 B2
(45) Date of Patent: Feb. 14, 2006

(54) LATERAL LOW-SIDE AND HIGH-SIDE HIGH-VOLTAGE DEVICES

(75) Inventor: Xingbi Chen, Chengdu (CN)

(73) Assignee: University of Electronic Science and Technology, Chengdu (CN)

( * ) Notice: Subject to any disclaimer, the term of this patent is extended or adjusted under 35 U.S.C. 154(b) by 0 days.

(21) Appl. No.: 10/951,444

(22) Filed: Sep. 28, 2004

(65) Prior Publication Data

US 2005/0110097 A1    May 26, 2005

(30) Foreign Application Priority Data

Oct. 16, 2003  (CN) .......................... 200310101268

(51) Int. Cl.
*H01L 29/94* (2006.01)

(52) U.S. Cl. ...................... 257/342; 257/213; 257/288; 257/327; 257/335; 257/341

(58) Field of Classification Search .................... None
See application file for complete search history.

(56) References Cited

U.S. PATENT DOCUMENTS

| | | |
|---|---|---|
| 5,726,469 A | 3/1998 | Chen |
| 6,245,609 B1 * | 6/2001 | Tsai et al. |
| 6,310,365 B1 | 10/2001 | Chen |

OTHER PUBLICATIONS

X.B. Chen, et al. "Theory of Optimum Design of Reverse-Biased p-n Junctions Using Resistive Filed Plates and Variation Lateral Doping" Solid-State Electronics, (1992) vol. 35, No. 9, pp. 1365-1370.

X.B. Chen, et al. "Lateral High-Voltage Devices Using an Optimized Variational Lateral Doping" Int. J. Electronics, (1996) vol. 80, No. 3, pp. 449-459.

* cited by examiner

Primary Examiner—Nathan J. Flynn
Assistant Examiner—Kevin Quinto
(74) Attorney, Agent, or Firm—Ladas and Parry LLP

(57) ABSTRACT

Lateral high-side and low-side high-voltage devices with low specific on-resistances are made in a first and in a second surface voltage-sustaining region, respectively. In the on-state of high-side MOST (the right portion of the figure), the voltage across its source and its drain is very low and only layer 5 (p-type) is depleted to a large extent, layer 6 and layer 7 remain neutral and can serve as drift region(s) of electrons and/or holes. The drift region can be used for a single n-MOST or p-MOST, or even a parallel connection of n-MOST and p-MOST as shown in the figure. In the off-state of the high-side MOST, the voltage across its source and its drain is very large, but the voltage across its drain and the substrate 1 can be very low, and all of the layers in the first surface voltage-sustaining region are depleted, the depleted layer 5 produces an optimum variation lateral density of charge.

The low-side MOST (the left portion of the figure) is similar to the high-side MOST.

12 Claims, 13 Drawing Sheets

LATERAL LOW-SIDE AND HIGH-SIDE HIGH-VOLTAGE DEVICES

TECHNICAL FIELD

The present invention relates to semiconductor high-voltage devices and high-power devices, more particularly to surface voltage-sustaining structure for lateral high-side and low-side high-voltage and high-power devices in High-Voltage Integrated Circuits (HVICs) and Power Integrated Circuits (PICs).

BACKGROUND OF THE INVENTION

As shown in FIG. 1, a conventional HVIC includes four portions: a low-voltage control circuit, a low-side driver connected to ground, a high-voltage level shifter and a high-side driver. The voltage of the tub shown in this figure can be varied from the voltage of the ground up to the voltage of the bus, which has a high-voltage related to the ground.

In Ref. [1], the BCD techniques are presented for implementing the four circuits shown in the block of FIG. 1. However, DI and JI techniques must be used in BCD techniques. Therefore, the technologies employed are normally incompatible with conventional CMOS and BiCMOS technologies. Furthermore, the areas of the high-voltage devices made by BCD technologies are normally large. As a result, the costs of such HVICs or PICs are high.

In Ref. [2] and [3], the present inventor proposed techniques to implement high-side and low-side high-voltage devices by taking advantage of optimum variation lateral doping. The techniques are CMOS and/or BiCMOS technologically compatible, so that high-side and low-side high voltage devices as well as high-side drivers can be realized on a single chip with lower cost.

However, the lateral power MOSTs, especially the lateral high-side power MOST made by such techniques has a large specific on-resistance. This can be illustrated by FIG. 2, the middle portion of which schematically shows the structure of a high-side n-MOST. When a high voltage related to the substrate is applied on the drain electrode $D_H$, the n-layer of the first surface voltage-sustaining region is depleted in a large extent, remains a small part of it to be neutral. That means it offers a high specific on-resistance.

References related to the prior arts are:

[1] B. Marari, et al., <Smart Power IC's Technologies and Applications>, Springer-Verlag, Berlin, Heidelberg, N.Y., 1995.
[2] X. B. Chen, U.S. Pat. No. 5,726,469 or Chinese patent ZL 95108317.1
[3] X. B. Chen, U.S. Pat. No. 6,310,365 B1 or Chinese Patent, ZL 98116187.1.
[4] X. B. Chen, et al., "Theory of optimum design of reverse-biased p-n junctions using resistive field plate and variation lateral doping", Solid-State Electronics, Vol. 35, No. 9, pp. 1365–1370 (1992).
[5] X. B. Chen, et al., "Lateral high-voltage devices using an optimized variational lateral doping", Int. J. Electronics, Vol. 80, No. 3, pp. 449–459 (1996).

OBJECT OF THE INVENTION

The object of this invention is to provide a surface voltage-sustaining structure for obtaining both high-side and low-side lateral devices having specific on-resistances lower than those given by U.S. Pat. No. 6,310,365 B1 with other advantages of that patent remaining unchanged.

SUMMARY OF THE INVENTION

According to the present invention, a surface voltage-sustaining structure for semiconductor devices is provided. It consists of two surface voltage-sustaining regions formed on the top of an n-type semiconductor substrate. The first voltage-sustaining region is in an area of a p-type layer on the substrate. The middle of this area is the largest voltage terminal of the high-side device, wherein the largest voltage means a highest negative potential with the potential of the substrate taken as zero. The edge(s) of this area has (have) a floating voltage. The p-layer is covered with thin n-type layer except those areas around the middle of said area. The average ionized acceptor density of p-layer subtracted by the donor density of the n-layer decreases gradually or stepwise from a value of $N_B W_{pp}$ at the middle to a very small value at the edge(s), where $N_B$ stands for the doping concentration of the n-type substrate, $W_{pp}$ stands for the depletion width of a one-sided abrupt parallel plane junction made by the same substrate under its breakdown voltage. The applied breakdown voltage, $V_B$, across the middle and the edge is a negative value. It is required that the acceptor density of this p-layer should by close to $2N_B W_{pp}$ at the place close to the middle.

The n-layer covered on the p-layer can be again covered by a p-layer and even a multiple alternately covering n-layer and p-layer can be used. In calculation of the average effective ionized acceptor density, all the ionized impurities should be taken into account.

In the case of the voltage of the floating terminal equals to that of the largest voltage terminal, then, except the lowest p-layer, all the n-layer and p-layer in the surface voltage-sustaining region are only depleted very small parts of them, because they are equi-potential and a negligibly small parts of them to be depleted are enough to support the built-in voltage ($V_{bi}$) between each neighboring n-layer and each p-layer. The first surface voltage-sustaining region and the substrate is then a plane junction alike.

The voltage between the floating terminal and the substrate is sustained by the second surface voltage-sustaining region. The second surface voltage-sustaining region has the same structure as the first surface voltage-sustaining region. The end of the n⁺-region of this region is connected to the substrate, that is, they have the same potential. This potential is assigned to be zero in this patent. The doping density of the lowest p-layer in the second surface voltage-sustaining region can be set as the same as the first region, but can also be different to the first region. However, the maximum acceptor density near the floating voltage terminal should not be smaller $N_B W_{pp}$.

In both regions, a decrease of the effective average density of the ionized acceptor from the position of the largest voltage to the position of the smallest voltage must be realized. There are lots of methods to realize the variation of the effective charge density as described in Ref. [2] and Ref. [3]. Attention should be paid that in this patent, the real variation of the effective charge density is not due to a variation of the compensation of an n-layer on its top, but due to a variation of the density of the lowest p-layer itself. Not to mention, such a variation can also be realized by using some layout mentioned in Ref. [3].

The majority lateral devices using this invention has a advantage that the carriers used in the on-state are the electrons in the n-layer and/or the holes in the p-layer above the bottom p-layer. The bottom p-layer serves for sustaining the voltage to the substrate, whereas the layers above the bottom p-layer serves for the drifting of the carriers, due to that they are neutral in the conduction-state. Therefore, it provides a much smaller specific on-resistance.

The p-type and n-type semiconductor stated above can be exchanged and then the largest voltage means a high positive voltage.

DESCRIPTION OF THE PREFERRED EMBODIMENTS

A reverse-biased p-n junction (diode) is the basis of most semiconductor devices, such as BJT, JFET and MOSFET. Therefore, the description of this invention is introduced by an explanation of the surface voltage-sustaining structures of the diode shown in FIG. 3 and FIG. 4.

Figure 1:
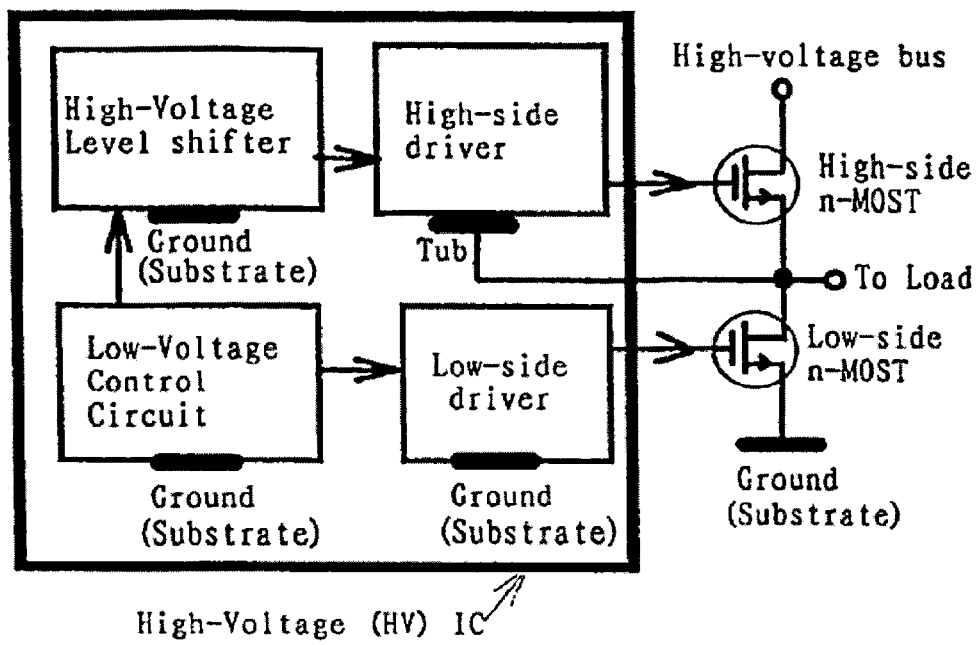
FIG. 1 shows schematically a conventional high-voltage integrated circuit.
Figure 2:
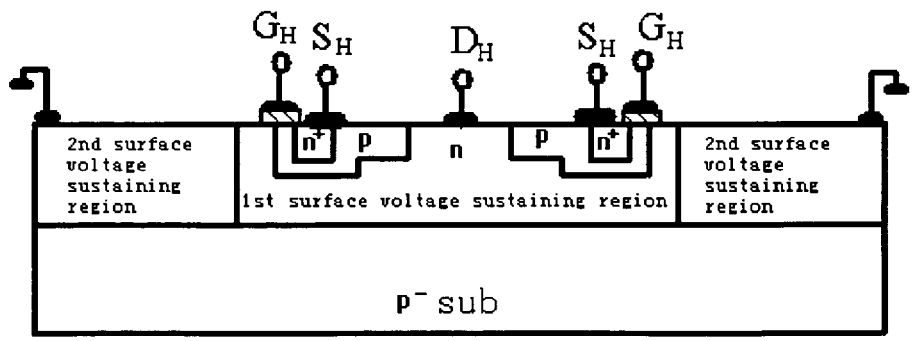
FIG. 2 shows a cross-section of a high-voltage n-MOST formed by the technique of U.S. Pat. No. 6,310,363 B1 (Prior art).
Figure 3:
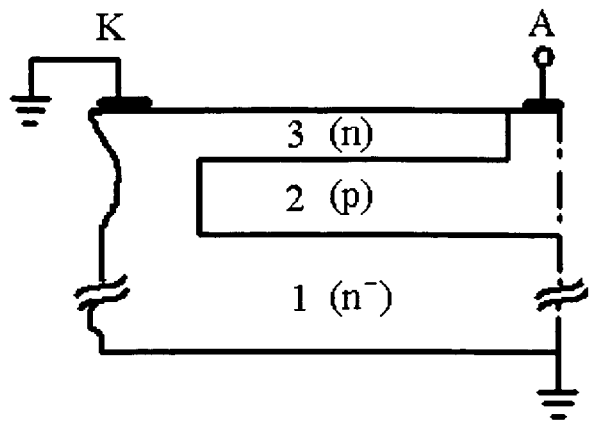
FIG. 3 shows schematically a surface voltage-sustaining region (a p-layer 2 and an n-layer 3) of a low-side diode of this invention.

Under a reverse biased condition, the diode shown in FIG. 3 sustains the voltage by a depletion region in the n-type substrate 1. The p-type layer 2 has a corresponding depletion region with opposite charges. The depletion region has a maximum width in the middle, i.e., on the dotted-dash line under the anode A, and a very small width under the cathode K. According to Ref. [4] and [5], the largest breakdown voltage can be achieved is 95% of that of a parallel plane abrupt junction by making the depleted acceptor density of p-layer 2 subtracted by the depleted donor density of n-layer 3 being a proper function of the distance from A (towards K).

Figure 4:
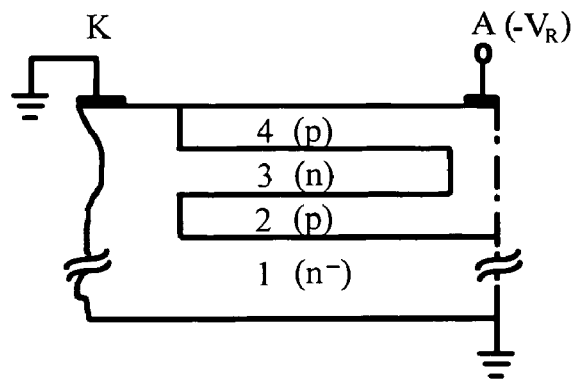
FIG. 4 shows schematically a surface voltage-sustaining region of a low-side diode of this invention, which is more complicated than that of FIG. 2.

The same argument can be applied to FIG. 4. The difference of this figure and FIG. 3 is only that here another p-layer 4 is on the n-layer 3. The effective ionized acceptor is the result of ionized density of p-layer 2 plus that of p-layer 4 minus that of n-layer 3.

It is required that, to get the maximum breakdown voltage, p-layer 2 and the layers above it must be fully depleted, except the areas in small portions around anode A and cathode K. All the fully depleted layers (except the substrate) together construct a surface voltage-sustaining region.

Figure 5:
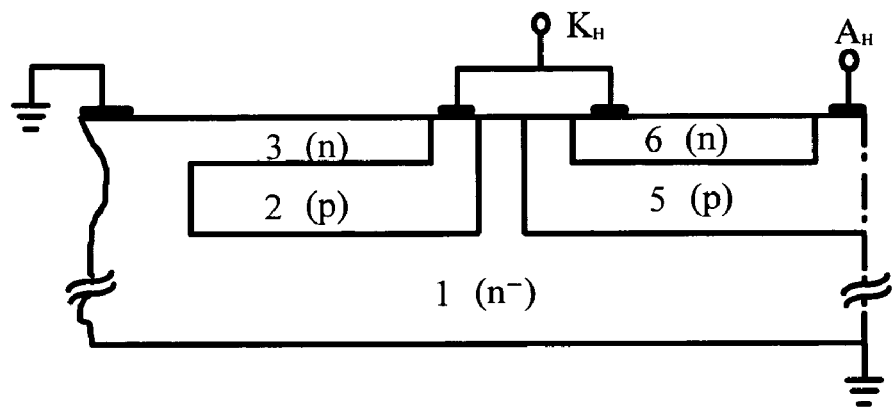
FIG. 5 shows a high-side diode of this invention by using the basic structure of FIG. 3 (layer 5 and layer 6 together formed a first surface voltage-sustaining region, layer 2 and layer 3 together formed a second surface voltage-sustaining region).

The structure shown in FIG. 3 and FIG. 4 can not only form low-side diodes but also can form high-side diodes, as shown in FIG. 5, FIG. 6, FIG. 7 and FIG. 8. If the p-layer 5 and n-layer 6 in FIG. 5 are made the same as the p-layer 2 and n-layer 3 in FIG. 3 respectively, then the high-side diode can have the same breakdown voltage as the low-side diode. Note that the potential of the cathode $K_H$ may have the same potential as the substrate, but may also have a potential close to that of the anode $A_H$. The latter case occurs when the high-side diode is in conduction. Therefore, a second surface voltage-sustaining region must exist between $K_H$ and the edge at the surface, since the potential at the edge is the same as the substrate ("ground"). This region is constructed by layer 2 and layer 3, as shown in FIG. 5.

The subscripts H and L of the symbols representing electrodes refer to the electrode of the high-side device in the first surface voltage-sustaining region and the electrode of the low-side device in the second surface voltage-sustaining region respectively.

Note that there is a region to separate p-layer 5 and p-layer 2 and to separate n-layer 6 and n-layer 3. This region is made to avoid direct connection of $A_H$ and $K_H$ and direct connection of $K_H$ and the substrate, and called as isolation region in this patent.

Figure 6:
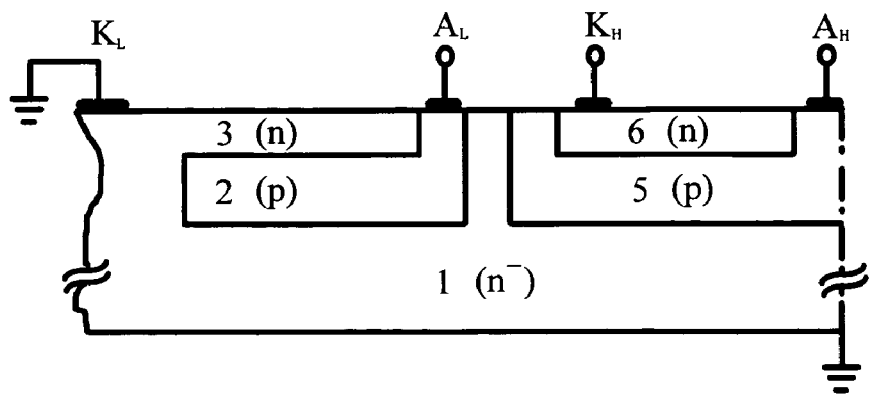
FIG. 6 shows a high-side diode and a low-side diode by using the basic structure of FIG. 3

FIG. 6 shows a high-side diode and a low-side diode by using the basic structure of FIG. 3. Due to that there is an isolation region between $K_H$ and $A_L$, these two electrodes can have a different potential, of course, they can be also made to be equal potential by an outer connection, if necessary.

Figure 7:
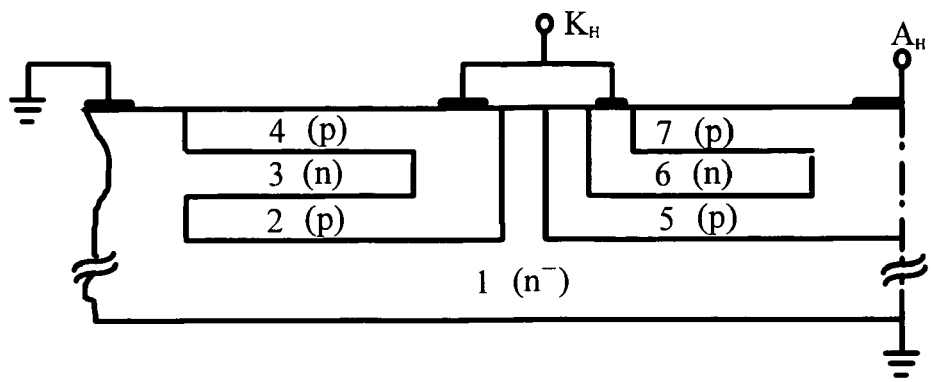
FIG. 7 shows a high-side diode by using the basis structure of FIG. 4.
Figure 8:
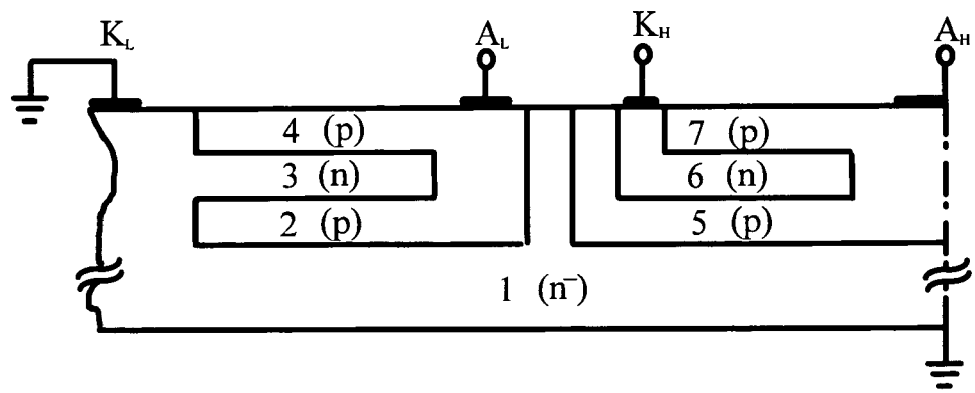
FIG. 8 shows a high-side diode and a low-side diode by using the basic structure of FIG. 4.

FIG. 7 shows a high-side diode by using the basic structure of FIG. 4. The second surface voltage-sustaining region, which includes p-layer 4, n-layer 3 and p-layer 2, can be used to make a low-side diode, as shown in FIG. 8 p-layer 5, p-layer 7 and n-player 6 should be the same as p-layer 2, p-layer 4 and n-layer 3, if one wants the high-side diode have the same breakdown voltage as that of the low-side diode.

Figure 9:
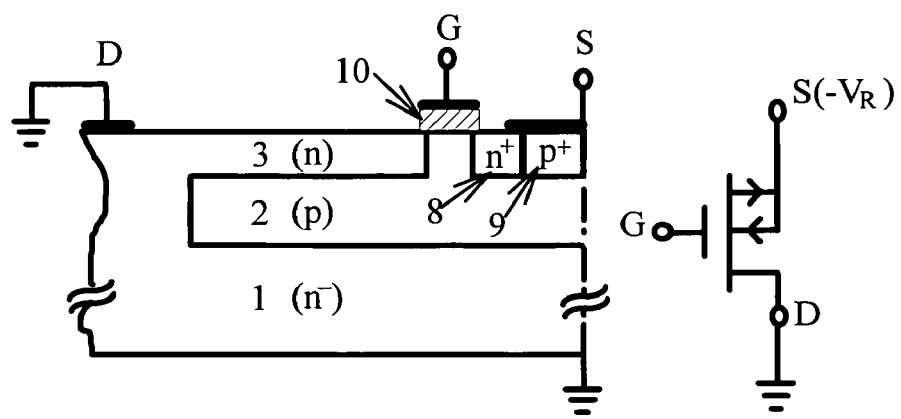
FIG. 9 shows a low-side MOST by using the basic structure of FIG. 3 (the figure shown on the right is its circuit symbol).

As stated before, once one can make a high-voltage diode, then it can be used to realize a high-voltage transistor. FIG. 9 shows a low-side MOST by using the basic structure of FIG. 3. The source-body of this MOST is connected to the middle of p-layer 2, it has a negative high voltage to the substrate, which is connected to the drain D. The right part of this figure shows the symbol of this device, where D is the drain electrode, S is the source electrode and G is the gate electrode. The shaded area 10 stands for the gate oxide or gate insulator. S is connected both to the n⁺-source region 8 and source-body region through p⁺-region 9. The difference of this lateral MOST to that presented in Ref. [2] is: p-layer 2 is for sustaining the voltage to the substrate, but not for making a drift region, the latter is made by n-layer 3. Assume that the surface voltage-sustaining region should contribute a charge density corresponding to a dose $D_0$ to obtain the maximum reverse voltage, where $D_0$ stands for $N_B W_{pp}$, then, the dose $D_0$, the effective number of ionized acceptors in unit area, should decrease as the lateral distance increases from the middle line, which is through the source S, and eventually approaches to zero.

One method to realize such a dose is as follows. The dose of p-layer 2 starts from a value of $2D_0$ at a certain lateral distance from the middle line (dotted-dash line in the figure), starts decreasing gradually from the left edge of gate electrode G according to the lateral distance, and eventually becomes a value of $D_0$. The dose of n-layer 3 is a constant, $D_0$. Thus, when a voltage close to the breakdown voltage is applied, the effective depleted acceptor density under the left edge of G is $D_0$, since half of acceptor density in p-layer 2 has been offset by $1D_0$ of donor density of n-layer 3. At the end of the surface voltage-sustaining region (close to the drain electrode), the effective acceptor density is zero, since $1D_0$ of p-layer 2 is totally offset by $1D_0$ of n-layer 3.

Figure 10:
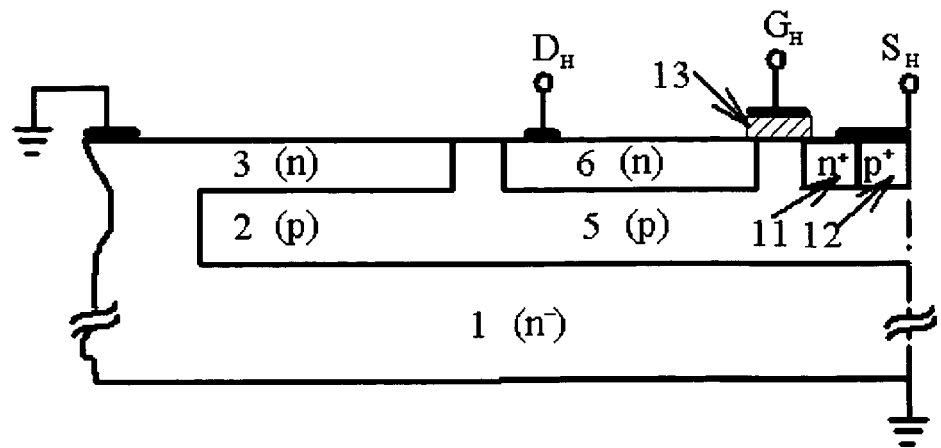
FIG. 10 shows a high-side MOST by using the basic structure of FIG. 5.

A high-side high-voltage MOST can be used by similar method as shown in FIG. 10, where $S_H$, $D_H$ and $G_H$ stand for the electrodes of source, drain and gate of the high-side MOST respectively. $S_H$ is connected to n⁺-region 11 and p⁺-region 12, the latter is connected to source-body, layer 13 is the gate oxide or gate insulator. The advantage of this high-side MOST compared to that of Ref. [3] is obvious. The specific on-resistance here is much lower than that in Ref. [3]. This is because, when the high-side MOST is in conduction-state, $D_H$ has almost the same potential of that of $S_H$, the latter has a reverse voltage $-V_R$ to the substrate. The depleted dose for supporting this voltage relies on p-layer 5 and has nothing to do with n-layer 6, which is now a neutral drift region, all the electrons in this region are the carriers for conduction. p-layer 5 and n-layer 6 together construct the first surface voltage-sustaining region, and p-layer 2 and n-layer 3 together construct the second surface voltage-sustaining region. There is a p-region between the two voltage-sustaining regions, to separate n-layer 6 and n-layer 3 to avoid electrons flowing directly from the substrate to $D_H$.

Figure 11:
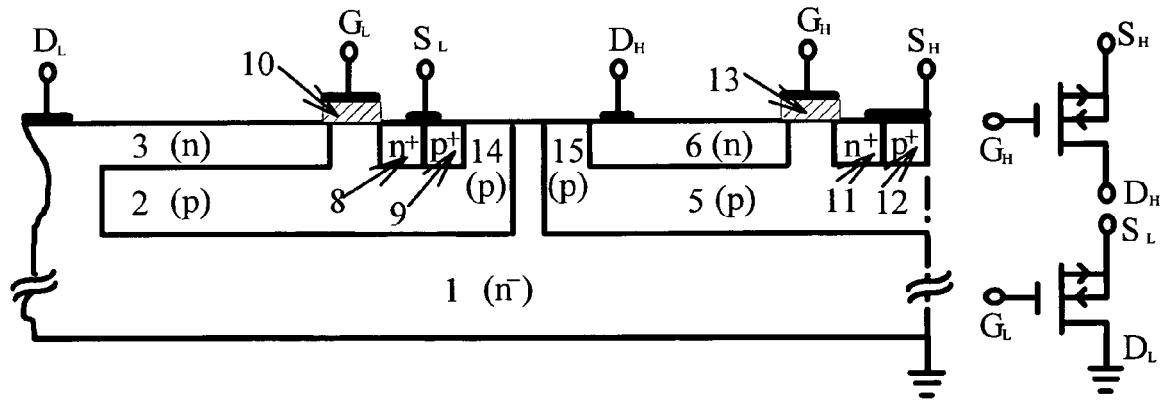
FIG. 11 shows a high-side MOST and a low-side MOST by using the basic structure of FIG. 5 (the figure shown on the right is their circuit symbols).

The second voltage-sustaining region shown in FIG. 10 can also be used to form a low-side MOST. FIG. 11 shows such a case. An n-region between p-region 14 and p-region 15 is set to avoid direct connection of the source of the low-side device, $S_L$, to the source of the high-side device, $S_H$. It should be mentioned that $D_H$ isn't necessary to be directly connected with $S_L$. A small voltage difference between them is allowable. However, in most practical cases, they are connected together and form a tub. The right portion of FIG. 11 is the circuit's symbols of the devices.

Figure 12:
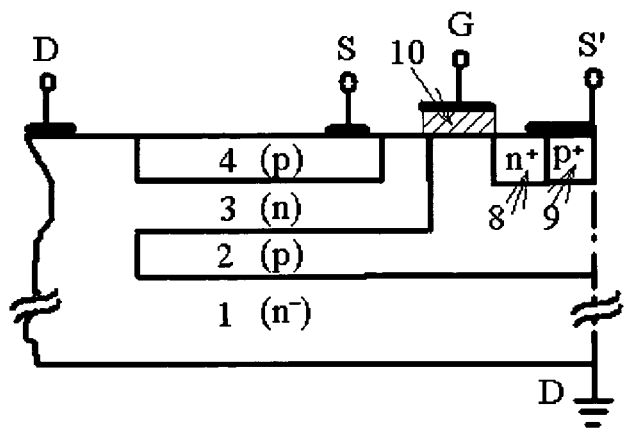
FIG. 12 shows a low-side MOST by using the basic structure of FIG. 4.

In order to further reduce the on-resistance of the high-side MOST, the voltage-sustaining region can be made having multiple layers. FIG. 12 shows a structure of 3-layers. One of the design methods is like this. The top p-layer 4 has a dose of $D_0$, n-layer 3 has a dose close to $D_0$, the bottom p-layer 2 has a dose of $D_0$ at the place of the largest voltage and a dose of zero at the place close to D. Thus, in conduction state, n-layer 3 is neutral, providing a small specific on-resistance.

However, there is still another method can produce a further small specific on-resistance. The dose of p-layer 2 at the place of the maximum voltage is set to be $2D_0$, at the place of the minimum voltage is set to be $D_0$. The dose of p-layer 4 is $D_0$ and the dose of n-layer 3 is $2D_0$. Thus, in conduction state, the dose of available carriers (electrons) in n-layer is almost $2D_0$.

Note that in Ref. [3], the variation of charge density in the off-state is due to a compensation of flux from a variation of the charge density of the upper layers. However, in this invention, although a dose of $D_0$ of the bottom layer is compensated by the upper layers, the variation of average dose is due to the remaining dose of the bottom itself.

The dose of n-layer 3 should not be larger than $2D_0$. Since when n-layer 3 is fully depleted, half of its dose produces a flux upwards and terminated by charge of p-layer 4, the remaining half produces a flux downwards and terminated by the charge of p-layer 2. These two fluxes correspond a field of $qD_0/\epsilon_s$ each, where q is the electron charge and $\epsilon_s$ is the permittivity of the semiconductor. This field is already the critical field of breakdown, $E_{crit}$.

Actually, as stated in Ref. [4], there is another lateral field parallel to the surface, which has a maximum value of about $E_{crit}/3$. Therefore, the component of the field perpendicular to the surface should not exceed $0.94E_{crit}$. As a consequent, the allowable dose of n-layer 3 is less than $1.88D_0$. Furthermore, if any layer is made by interdigitated layout, then a field perpendicular to both of the above-stated components occurs. In that case, the dose of n-layer 3 should be less than $1.8D_0$.

Figure 13:
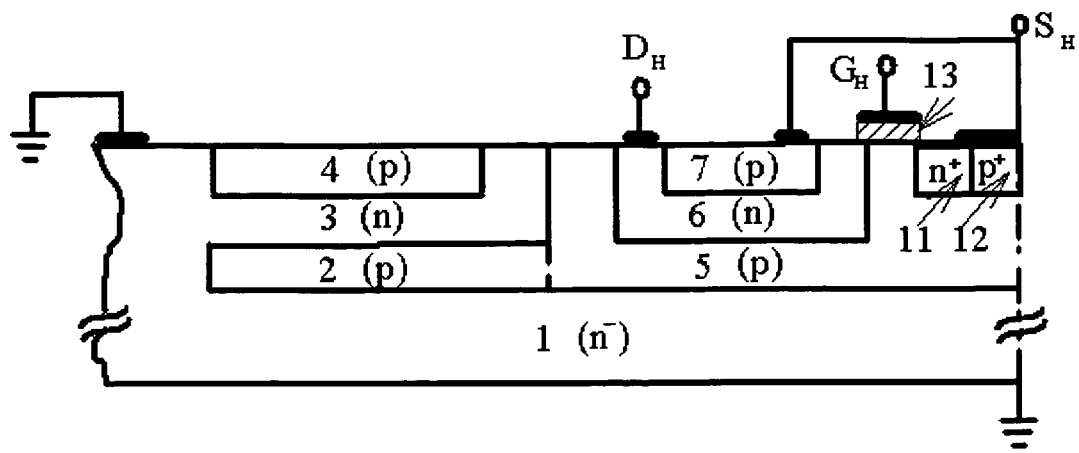
FIG. 13 shows a high-side MOST by using the basic structure of FIG. 7.

FIG. 13 shows a high-side MOST by using the basic structure of FIG. 7, where the left portion is the second voltage-sustaining region and the right portion is the first voltage-sustaining region.

Figure 14:
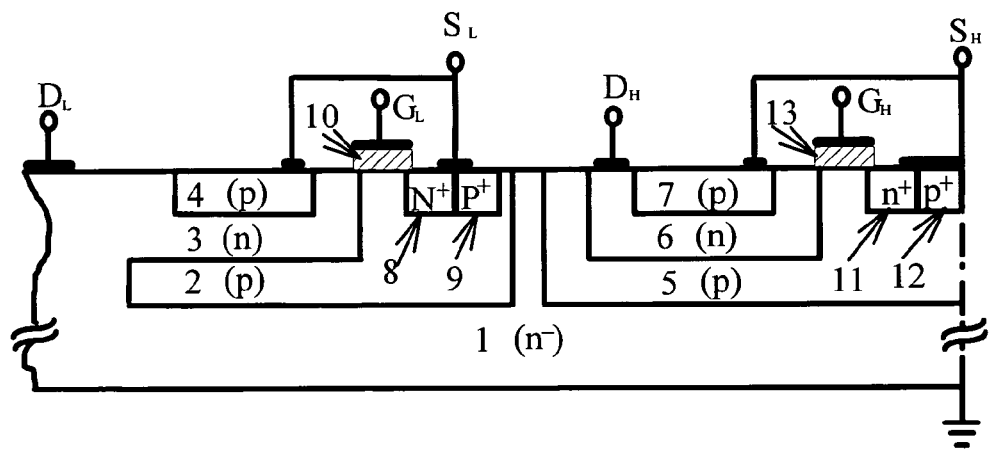
FIG. 14 shows a high-side MOST and a low-side MOST by using the basic structure of FIG. 7.

FIG. 14 shows a high-side MOST and a low-side MOST by using the basic structure of FIG. 7. In the conduction-state of the high-side MOST, n-layer 6 and p-layer 7 are neutral due to the potential difference between $D_H$ and $S_H$ are very small. Thus, unlike the techniques provided by Ref. [3], the specific on-resistance of this patent is very small.

Figure 15:
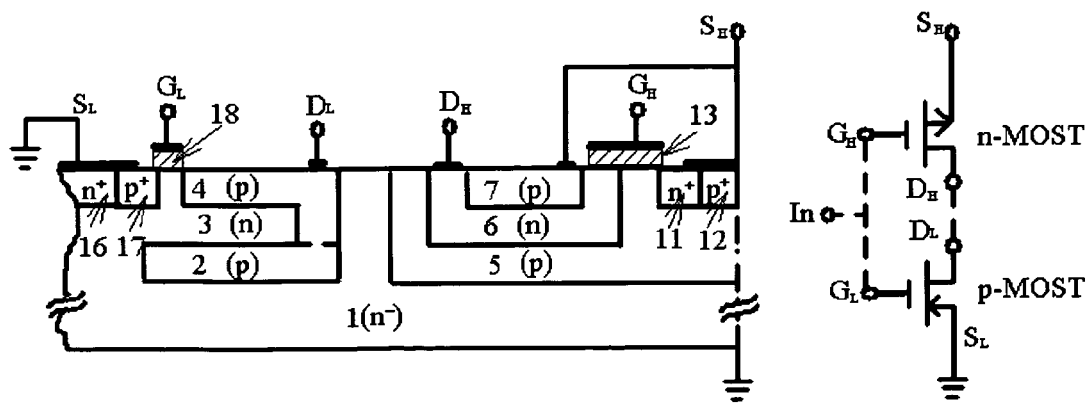
FIG. 15 shows a CMOS, where the source of the high-side n-MOST is connected to the largest voltage and the source of the low-side p-MOST is connected to the smallest voltage (the figure on the right shows their circuits symbols).

A high-voltage CMOS can also be made by using the two surface voltage-sustaining regions. FIG. 15 shows one of the examples. The source $S_H$ of the high-side n-MOST is connected to the largest (negative) voltage and the source $S_L$ of the low-side p-MOST is connected to the smallest voltage, i.e., the substrate. The source region of the low-side p-MOST is p$^+$-region 17, which is connected to the source-body via the electrode $S_L$ and n$^+$-region 16. The gate oxide or gate insulator is shown as the shaded area 18. The symbols of circuits of the CMOS are shown in the right portion of the figures, where the dash lines are the outer connection if it is necessary.

Figure 16:
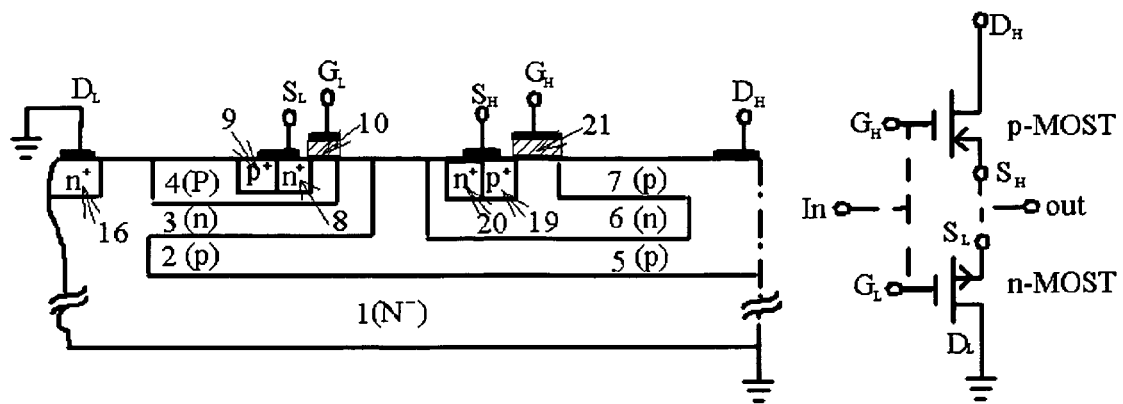
FIG. 16 shows a CMOS, where the drain of the high-side p-MOST is connected to the largest voltage and the drain of the low-side n-MOST is connected to the smallest voltage (the figure on the right shows their circuits symbols).

FIG. 16 shows another example of high-voltage CMOS, where the high-side is a p-MOST and the low-side is an n-MOST. The drain-electrode $D_H$ of high-side p-MOST is connected to the maximum (negative) voltage and the drain-electrode $D_L$ of low-side n-MOST is connected to the smallest voltage, i.e., the substrate. The source electrode $S_H$ of the high-side p-MOST is connected to a source p$^+$-region and source body via n$^+$-region 20. The shaded area 21 is the gate oxide or gate insulator. The symbols of circuits of this CMOS are shown in the right portion of the figure.

Figure 17:
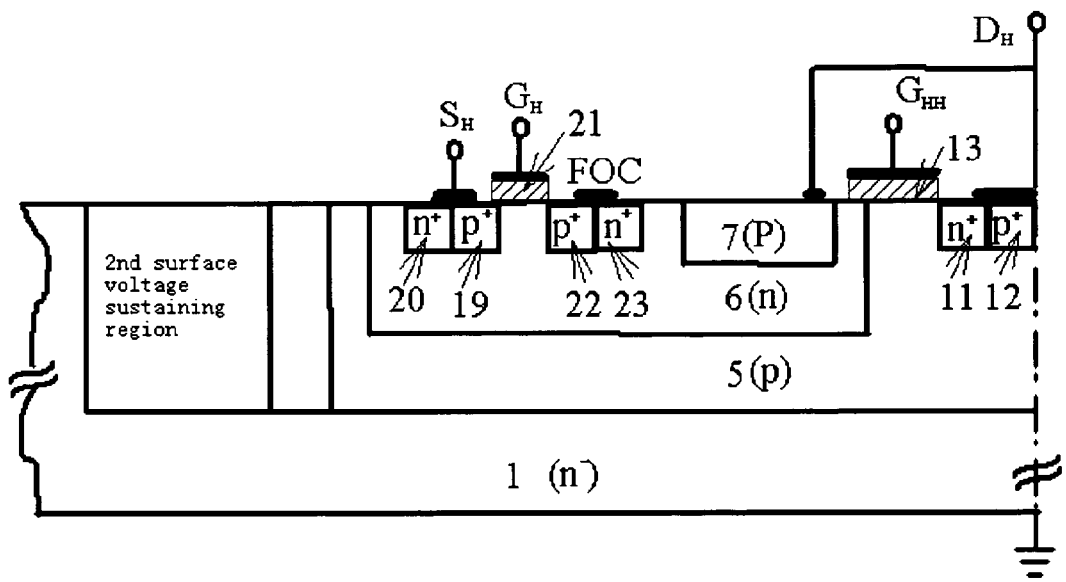
FIG. 17 shows a CMOS where the high-side is a pseudo-pMOST.

The specific on-resistance of the high-side p-MOST is larger than that of the low-side n-MOST, due to that the dose of p-layer 7 is not very large and the mobility of holes is normally lower than that of electrons. In order to overcome this drawback, it is proposed a method in this invention as shown in FIG. 17. In this figure, a p-MOST is built by a gate $G_H$ between a p$^+$-source region 19 and a p$^+$-drain region 22. The p$^+$-region 22 is connected through a floating ohmic contact (FOC) to n$^+$-region 23. In the on-state of this p-MOST, the hole current can then transfer to an electron current by FOC, flowing in n-type layer 6. At another place, there is an n-MOST made by an n-type source region 11, a gate $G_{HH}$. The electron current can flow when this n-MOST is in on-state. If the n-MOST keeps in on-state, then the current in the high-side device is controlled by the p-MOST, but the drift region is n-layer 6, which produces a very low specific on-resistance. Such device is called a pseudo-p-MOST (p-pMOST) in this invention. According to the same mechanism, one can also make pseudo-n-MOST (p-nMOST), where the first symbol p refers to "pseudo". The structure of the second surface voltage-sustaining region is not shown in FIG. 17, since it has been described hitherto many times.

Figure 18:
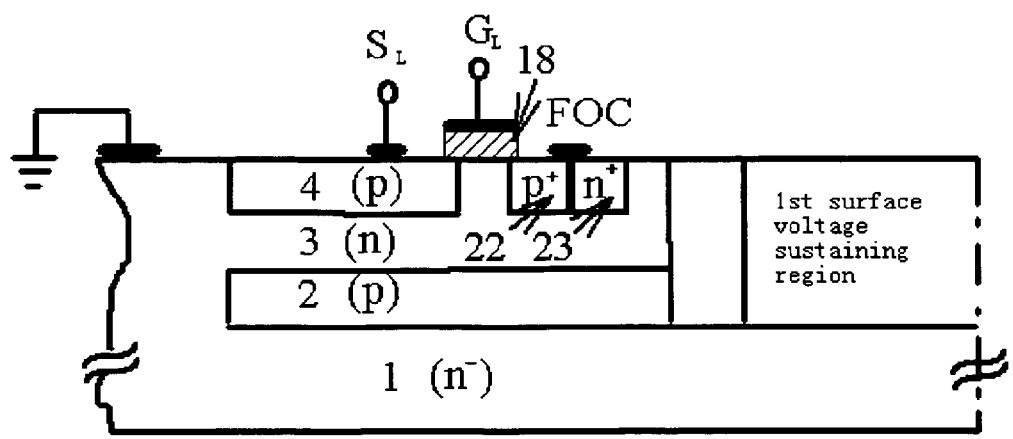
FIG. 18 shows a low-side pseudo-pMOST by using a floating ohmic contact (FOC).

The source n$^+$-region 8 in FIG. 16 is made in p-layer 4. In case of layer 4 is very shallow and its dose is not large enough, the n$^+$-region 8 may cause the p-layer 4 there disappear or produces parasitic BJT effect. For this reason, the active region can be made to be a p-MOST shown as FIG. 18. This is again an example of a pseudo-MOST (p-pMOST), where the source is p$^+$-region 22 made on n-layer 3 and connected to the n-layer 3 via a FOC and n$^+$-region 23. The p-pMOST has a drift region, n-layer 3, providing a low specific on-resistance.

Figure 19:
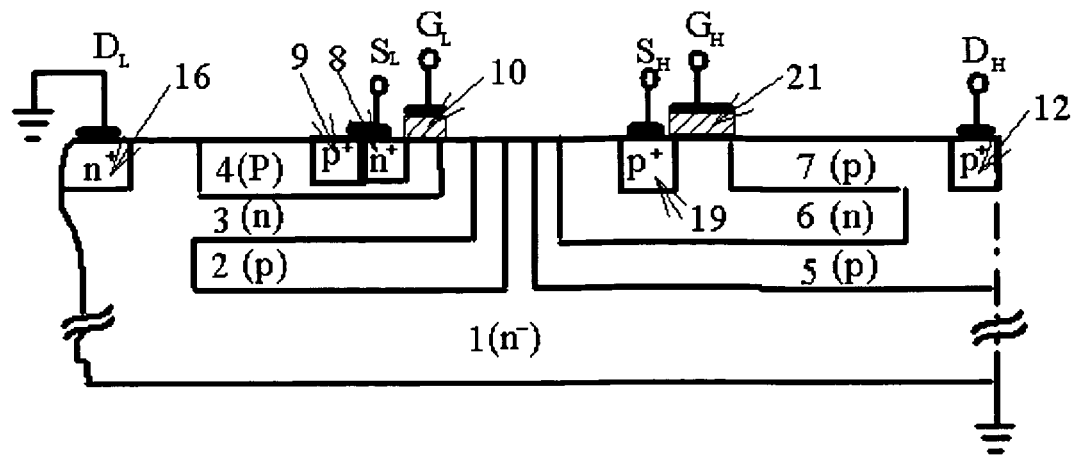
FIG. 19 shows a high-side p-MOST where the source electrode $S_H$ does not connected by an electrode with the source body.

The source electrode $S_H$ in FIG. 16 contacts both p$^+$-source region 19 and n-source-body 20. Actually, a contact to source body is not necessary in some cases. This is because, there is a neutral region under region 19 due to the existence of the second surface-sustaining region, causing no biasing effect by the source-body. FIG. 19 shows a high-side p-MOST, without a contact between source and source-body.

Figure 20:
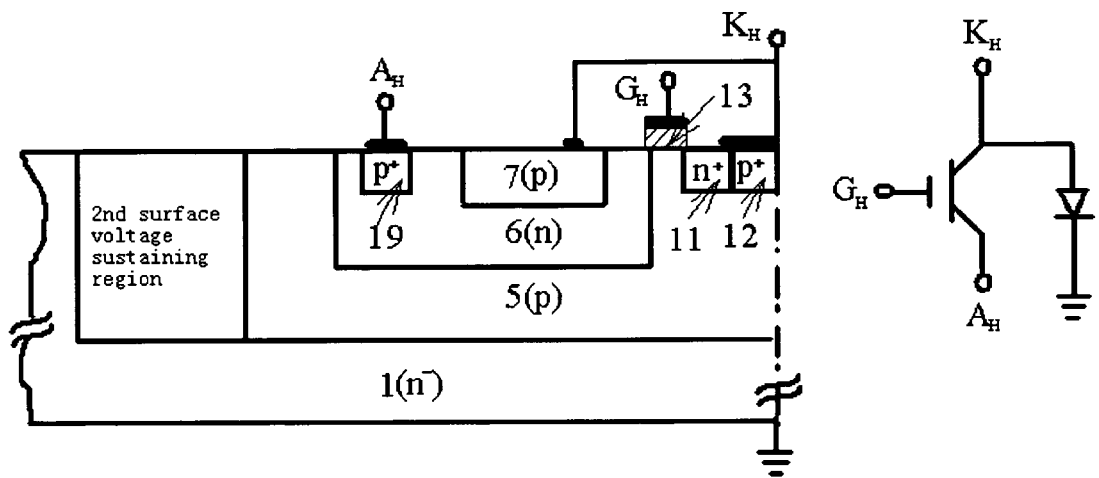
FIG. 20 shows a high-side LIGBT.

As mentioned before, many high-voltage devices can be built by using the high-voltage sustaining p-n-junction. Lateral MOST is only one kind. FIG. 20 shows a high-side LIGBT. The right portion of this figure shows its symbol of circuit.

The surface voltage-sustaining region proposed in this invention can also be used to a make a fast turn-off LIGBT. In a conventional IGBT, a turn-off process has a long tail. For instance, in the turn-off transient, the electrons flow from n-layer 6 to the p$^+$-region 19 induces an injection of holes to layer 6. This is the reason that a long tail exists. However, by using a structure shown in FIG. 21, this effect can be eliminated. The feature of this structure is that it contains an auxiliary p-MOST, the drain of which is an FOC, connected to both p$^+$-region 22 and n$^+$-region 23, the anode AH Of IGBT serves as the source electrode. And a gate, $G_{HX}$, for this auxiliary p-MOST covers on an oxide or insulator layer 21, which in turn covers on the area between p$^+$-region 19 and p$^+$-region 22. In the on-state stage, a voltage larger than the threshold voltage of the n-MOST is applied to the normal gate, $G_H$. But a voltage smaller than the threshold voltage of the p-MOST is applied to the auxiliary gate $G_{HX}$, making the auxiliary p-MOST do not play any role. Therefore, the on-state is the same as a conventional LIGBT. In the turn-off stage, the voltages applied to the two gates are reversed, making n-MOST to be off and p-MOST to be on. Thus, the holes in the voltage-sustaining region flow to $K_H$ via p$^+$-region 12, and the electrons flow to n$^+$-region 23 then becomes a hole current by FOC. No holes are injected by the anode region 19, so far as the voltage drop across region 19 and region 22 is lower than a certain value, 0.6V for silicon device. The gate $G_{HX}$ is called as an extract gate.

Figure 22:
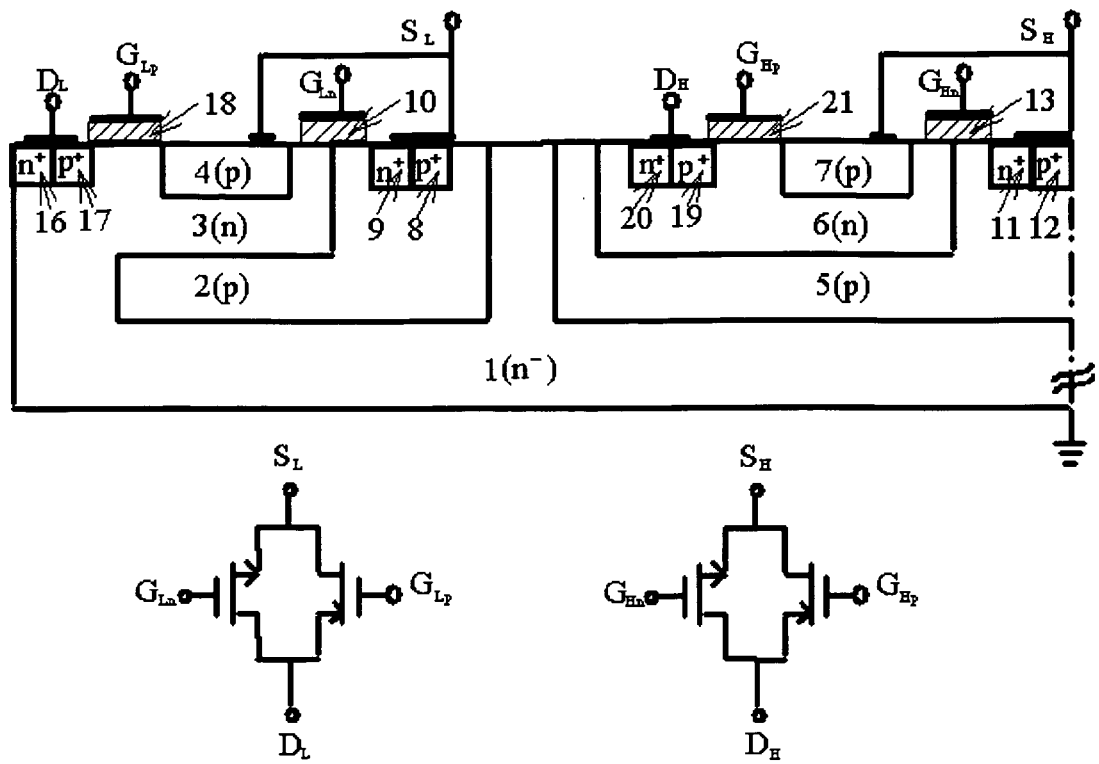
FIG. 22 shows a high-side transmission gate and a low-side transmission gate.

This invention also provides a device using both electrons and holes as majority carriers for conduction. The upper portion of FIG. 22 shows such devices of high-side and of low-side. Where $G_{Hn}$ and $G_{Hp}$ are the gate electrodes of high-side n-MOST and p-MOST respectively. Electrons can flow from $S_H$, via n$^+$-region 11, the inversion layer under the gate $G_{Hn}$ when it has a voltage higher than the threshold voltage of the n-MOST, n-layer 6, n$^+$-region 20 and eventually reaches the electrode $D_H$. Similarly, holes can flow following the way: $D_H$, p$^+$-region 19, inversion layer under $G_{Hp}$, p-layer 7, $S_H$. The bottom portion of this figure shows the symbols of the circuits, where the right part is for the high-side device. The left part is for the low-side device. The function of the low-side device is similar to the high-side device. The symbols S and D are for the n-MOST. Actually, from the point of view of the p-MOST, these two symbols should be exchanged.

Figure 23:
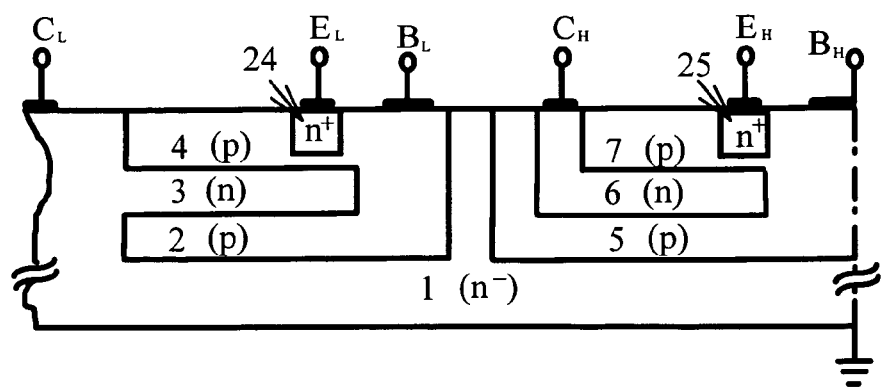
FIG. 23 shows a high-side BJT and a low-side BJT.

A low-side and/or High-side Bipolar junction transistor (BJT) can also be made by using the surface voltage-sustaining regions of this invention. FIG. 23 shows one example, where B, C and E stand for the electrodes of base, collector and emitter respectively. E is connected to n$^+$-region 24 (or 25) which in turn formed in p-layer 4 (or 7) for low-side BJT (or high-side BJT). When the emitter to base has a positive bias, electrons can be injected from n$^+$-region 24 (or 25) to the base region p-layer 4(or 7), and reach n-layer 3(or 6), eventually collected by the collector $C_L$(or $C_H$).

Figure 21:
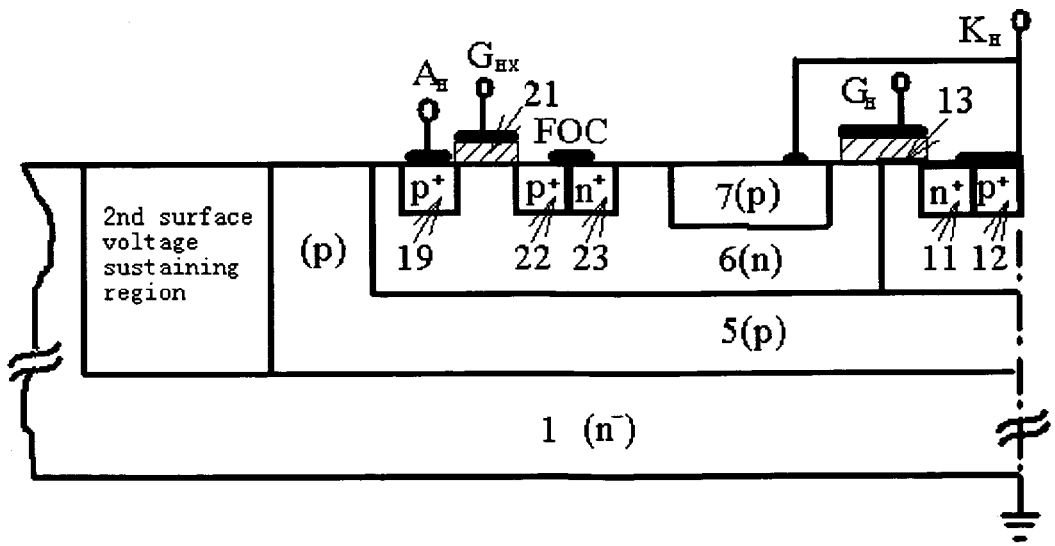
FIG. 21 shows a LIGBT, which has an auxiliary MOST for extracting minorities from the emitter.

The second surface voltage-sustaining region shown in FIG. 17, FIG. 20 and FIG. 21 can be used to form low-side device. The device can be the same as that of the high-side. However, it can also be a different device. For instance the high-side device can be an LIGBT and the low-side device can be a MOST, etc.

Figure 24:
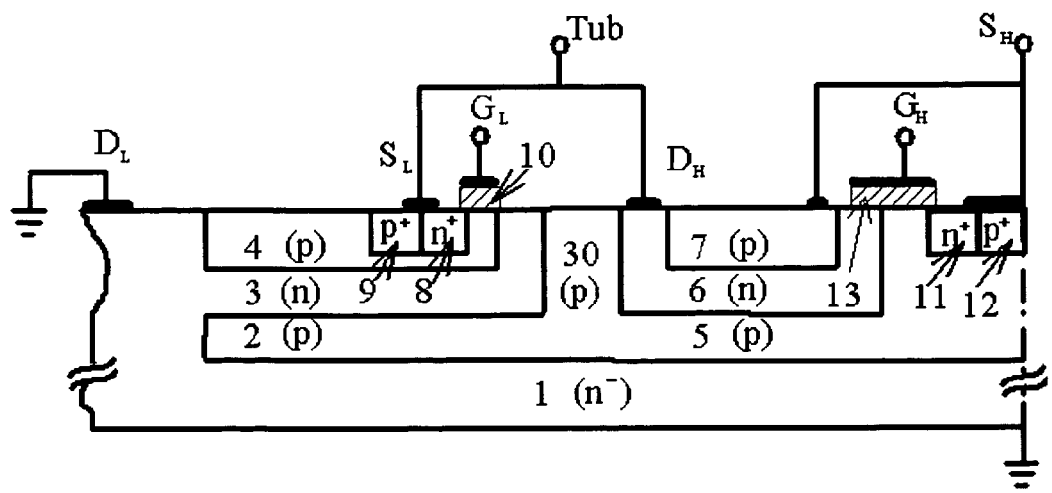
FIG. 24 shows a high-side MOST and a low-side MOST, where there is no n-region between the two devices.

The isolation between the first surface voltage-sustaining region and the second surface voltage-sustaining region has many methods to realize except stated above. For instance, an n⁻-region between p-layer 5 and p-layer 2 like shown in FIG. 5, FIG. 6, FIG. 7 and FIG. 8. FIG. 24 shows a high-side MOST and a low-side MOST, where there is a narrow p-region 30 between p-layer 5 and p-layer 2, instead of an n-region. The drain $D_H$ of the high-side MOST connected to the p⁺-region 9 and the n⁺-region 8 on the p-layer 4 through an outer connection. The place to be connected is the "tub". The source of the low-side MOST is made in p-layer 4 for preventing a direct connection of the source $S_H$ of the high-side and the source $S_L$ of the low-side through the bottom p-layer.

Figure 25:
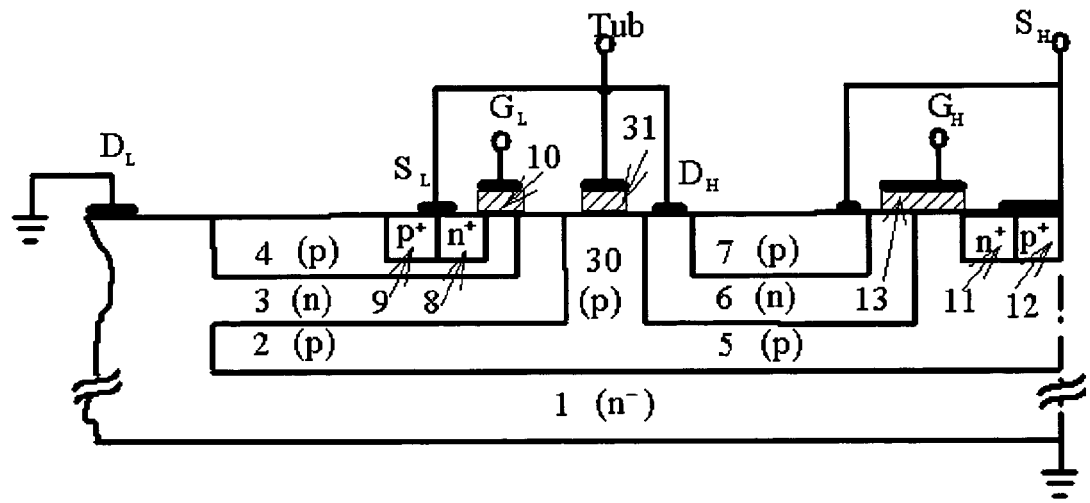
FIG. 25 shows a high-side MOST and a low-side MOST, where a p-region is between them, and there is an insulator layer on the top of the p-region, an electrode is placed on the top of insulator layer, the electrode is connected to the tub.

If p-layer 5 and n-layer 6 in FIG. 24 are not very thin, then layer 3 of the low-side drift region may have high on-resistance due to it has been depleted in a large extent. This is because, the voltage of the tub is small when the low-side is on, but the voltage of p-layer 5 is large, making a large reverse voltage between p-layer 2 and n-layer 3. To avoid the large potential difference between them, a method is shown in FIG. 25, where there is an oxide or insulator layer 31 on the top of p-region 30 covered by an electrode, which is connected to the tub.

Figure 26:
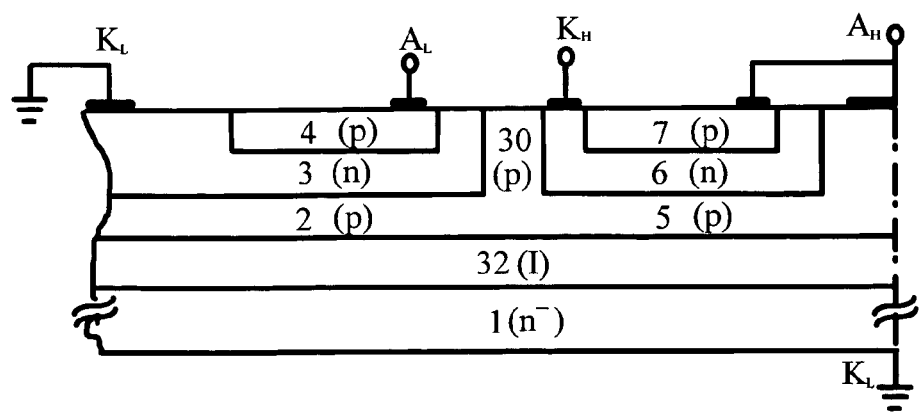
FIG. 26 shows an insulator layer is located between the substrate and the two surface voltage-sustaining regions.

Naturally, the surface voltage-sustaining region proposed in this invention can be made on a substrate through a thin insulator (SIS). FIG. 26 shows an insulator (I) layer 32, which is located between the substrate and the two surface voltage-sustaining regions of FIG. 8. The two regions are isolated each other by a p-region 30. It should be mentioned here, that the substrate must be connected to the cathode $K_L$ of the low-side diode by outer connection. Because according to Ref. [4], the optimum surface doping density is referred to sustain a voltage which has applied across the largest potential terminal on the surface and the substrate.

Figure 27:
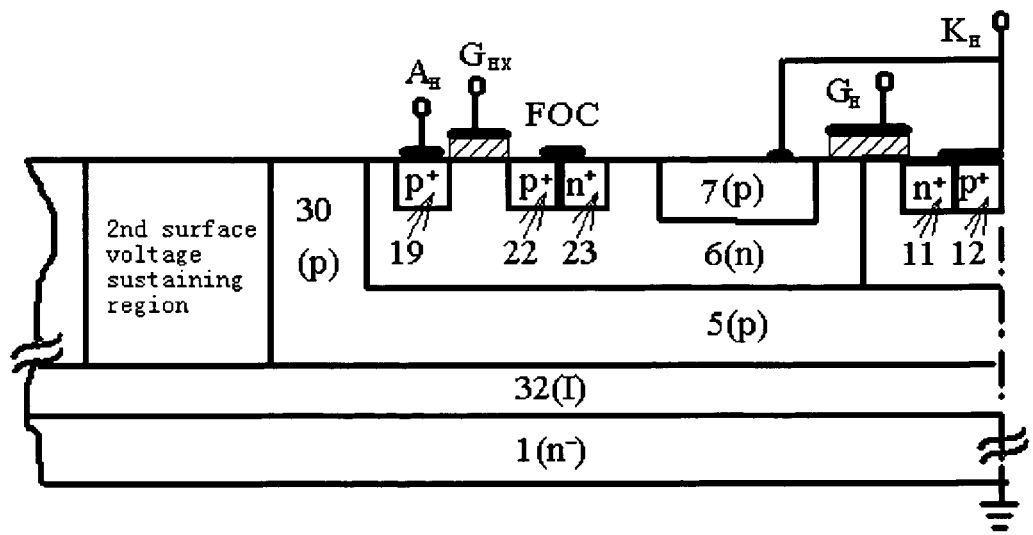
FIG. 27 shows a LIGBT, which is FIG. 21 alike but has an insulator layer between the device and the substrate.

FIG. 27 shows a LIGBT which is FIG. 21 alike but has an insulator layer (32) between the diode and the substrate. It should be pointed out here, that an electron flow from n-layer 6 through p-layer 5 to the substrate occurs probably in FIG. 21 in case of the p-layer 5 being too thin. In FIG. 27, this flow is not going to exist due to the insulator layer 32.

Figure 28:
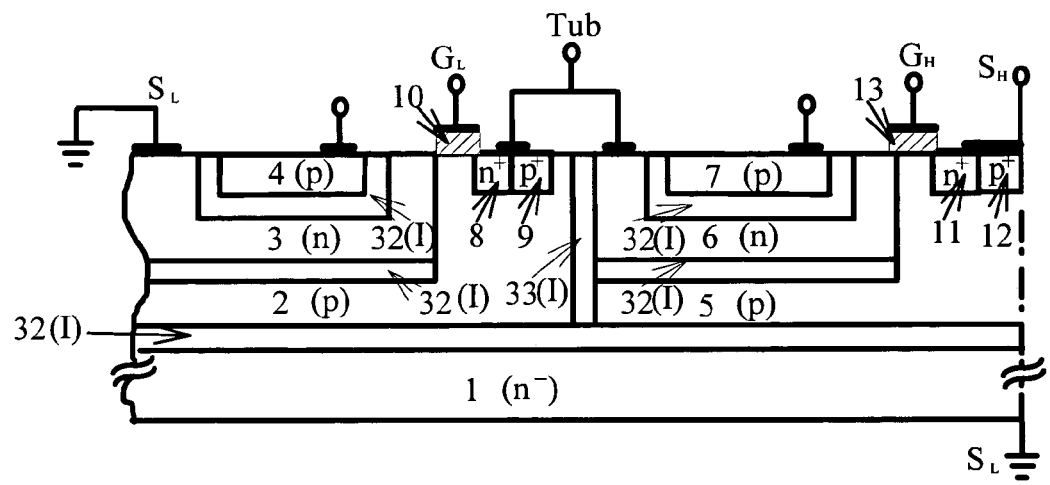
FIG. 28 shows that there are insulator layers to separate the regions having different conductivity type.

According to this invention, insulator layers can also be set between each neighboring p-layer and n-layer. FIG. 28 shows that there are insulator layers to separate the regions having different conductivity type (layer 2, layer 3, layer 4, layer 5, layer 6 and layer 7). Besides, an insulator layer 33 is set between the two surface voltage-sustaining regions and serves as an isolation region of these two regions.

Figure 29:
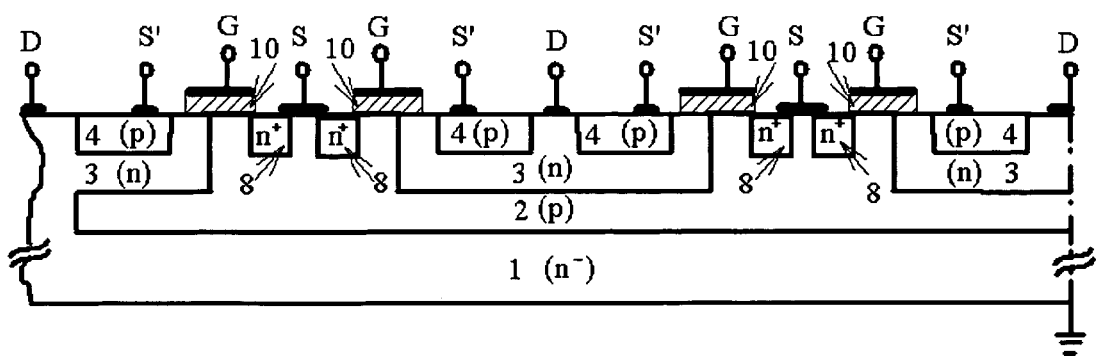
FIG. 29 shows a low-side n-MOST formed by many interdigitated cells connected in parallel.
Figure 30:
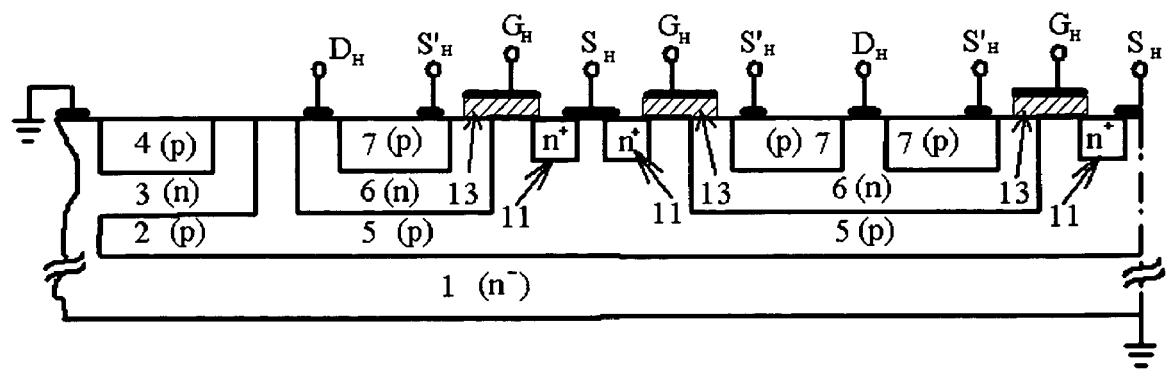
FIG. 30 shows a high-side n-MOST formed by many interdigitated cells connected in parallel.

It should be pointed out that, sometimes only one low-side or one high-side is more convenient in technology. FIG. 29 shows a low-side n-MOST formed by many interdigitated celles connected in parallel. The figure shows four of them. FIG. 30 shows a high-side n-MOST formed by many interdigitated celles connected in parallel. The figure shows three of them. A second surface voltage-sustaining region is shown on the left. The advantage of such a high-side device is that the isolation for the two surface voltage-sustaining regions can be saved.

Low voltage devices taking the maximum voltage of the high-side device or the maximum voltage of the low-side device as reference is readily to realize by using this patent.

Figure 31:
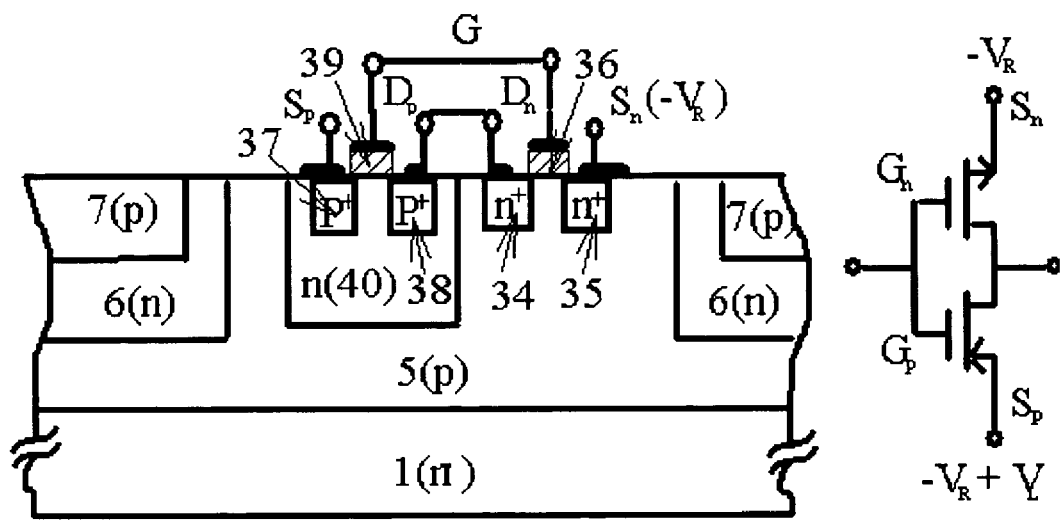
FIG. 31 shows a low voltage CMOS inverter, where the reference is the largest voltage of the high-side high-voltage device or that of the low-side high-voltage device.

FIG. 31 shows a low voltage CMOS inverter formed on the place having maximum voltage, i.e., the middle portion of p-layer 5 of high-side device. The source region, n⁺-region 35, of the n-MOST in the low voltage CMOS is connected by an electrode to the maximum voltage, $-V_R$. The gate of the n-MOST is connected to the gate of the p-MOST by outer connection, which serves also the input terminal of the CMOS. The p-MOST of the low voltage CMOS is made in an n-region, 40. The source of the p-MOST, p⁺-region 37, is connected to the n-region 40 through a electrode, which is applied with a voltage source having a positive voltage to $-V_R$. The right portion of this figure shows the symbols of these devices.

In practical application, it often encounters that a current should flow in the reverse direction to the normal current of the high-side and/or the low-side device. This current is normally diverted by a freewheeling element, shown as the two diodes $D_1$ and $D_2$ in the lower portion of FIG. 32. In the reverse conduction situation of the high-side device, the drain ($D_H$) voltage to the source ($S_H$) voltage of the device shown in FIG. 11 (or FIG. 14, or FIG. 15) makes n-layer 6 and p-layer 5 to be forward biased. Then, a parasitic bipolar with n⁻-substrate 1 as collector, n-layer 6 as emitter and p-layer 5 as base, is going to be on. The reverse current may flow to the substrate instead of the high-side source $S_H$.

Figure 32:
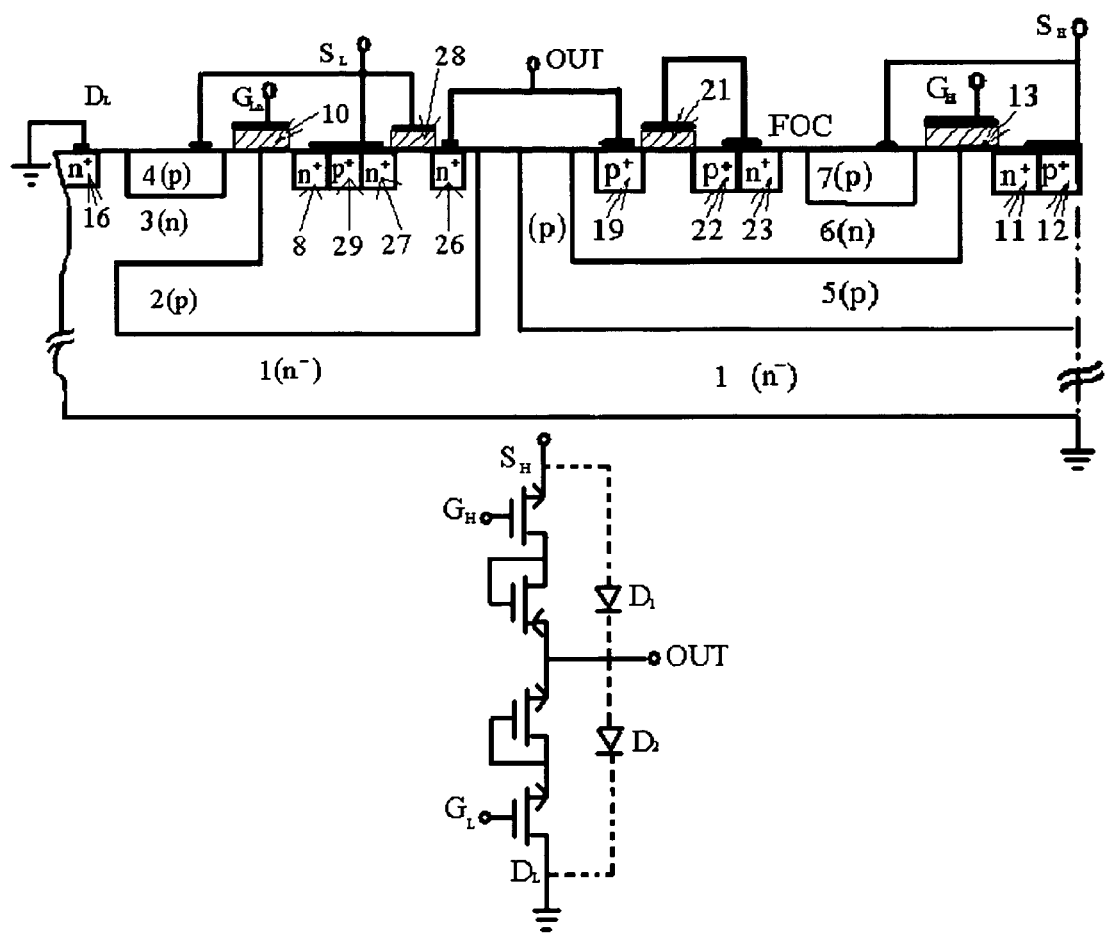
FIG. 32 shows a structure by using auxiliary MOSTs to prevent the parasitic BJT effect of the high-side and the low-side n-MOSTs during a flywheel time.

One method to avoid such parasitic BJT effects is to use a low voltage auxiliary MOST with the gate short circuited to the drain, and this MOST is in series connection with the high-voltage device. In the normal conduction mode of the high-voltage device, the low-voltage MOST has only a very small voltage drop due to that it is conducting and its channel length is very short. In the mode of a small reverse biasing voltage is applied to the series connected device. The low-voltage auxiliary MOST turns to be in off-state and can sustain a reverse voltage, which is normally only in an order of one volt due to the freewheeling diode connected in parallel to the series connected high-voltage device and low-voltage device. FIG. 32 shows a structure by using auxiliary MOSTs to prevent the parasitic BJT effect of the high-side and the low-side n-MOSTs during a flywheel time. In the high-side part (right portion of the structure), the structure is almost the same as that shown in FIG. 27, except that now $G_{Hx}$ is connected to FOC, the latter serves as the drain electrode of the low-voltage p-MOST. The electrode marked with "OUT" is for the output of the totem pole. In the low-side part (left portion of the structure), a low-voltage n-MOST is made on the area having largest voltage of the low-side n-MOST. The low-side high-voltage device is the same as shown in FIG. 14, where the n⁺-source region, 8, and the p⁺-source body region, 29, are the same as 8 and 9 in FIG. 14. The auxiliary n-MOST has an n⁺-drain region, 27, an n⁺-source region 26. The gate 28 is connected to the drain, which is in turn connected to the source electrode ($S_L$) of the low-side high-voltage n-MOST. The low portion of FIG. 32 shows the symbols of circuits of the device.

Figure 33:
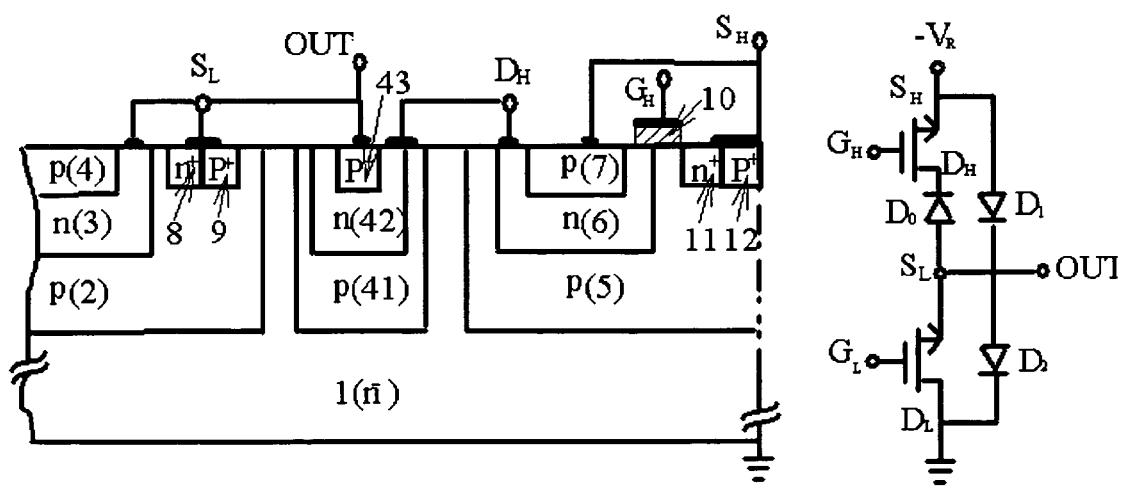
FIG. 33 shows by using a diode to prevent the parasitic BJT effect of the high-side n-MOST during a flywheel time.

Another method is shown in FIG. 33. A diode formed by p⁺-region 43 and n-region 42 is connected in series with the high-side n-MOST. In the reverse conduction situation, this diode is reverse biased, so that no current flows to the high-side device. The p-region 41 is connected to $D_H$ and to n-region 42 to avoid a direct connection of 42 with the n-substrate 1.

Figure 34:
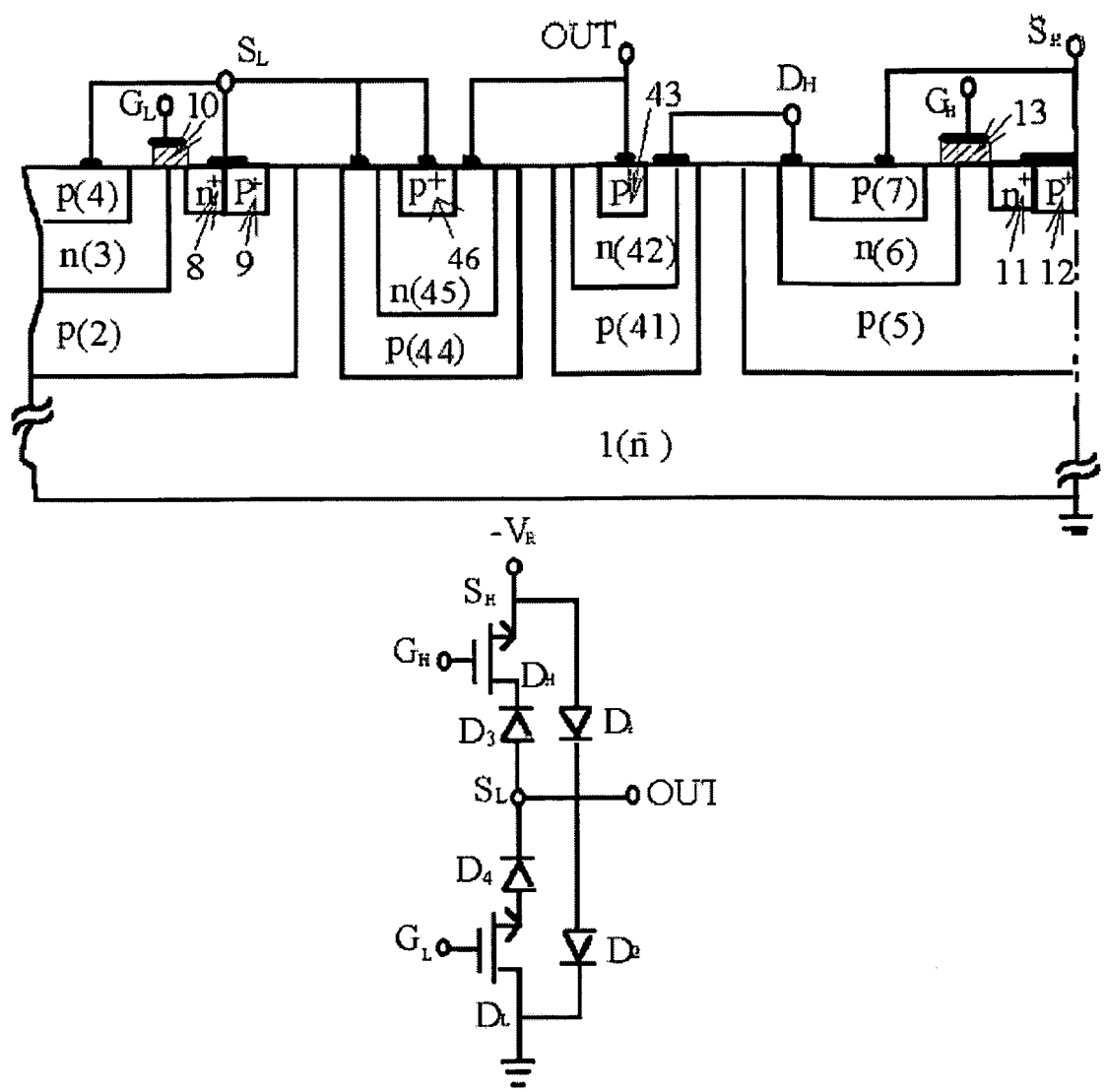
FIG. 34 shows by using some isolated surface islands to prevent the parasitic BJT effect of the high-side and the low-side nMOSTs during a flywheel time.

In the low-side device of FIG. 33, a flow of electrons from n⁻-substrate 1 into p-layer 2 and a flow of holes from the latter into the former may occur when the low-side device is positively biased. These two flows maybe slow down the response of the device due to they injected minorities. To avoid this effect, a diode $D_4$ can be made in series connection with the source electrode $S_L$ of the low-side device, as shown in the low portion of FIG. 34. The diode $D_4$ is formed by a p-region 44, an n-region 45 in the p-region 44 and a p$^+$-region 46 in the n-region 45.

Many examples of the application of this invention have been demonstrated. It is obvious for a person skilled in the art that the technique of the present invention can be used to a p$^-$-substrate without any difficulty. Also, a lot of applications without any difficulty in the spirit of this invention can be made.

What is claimed is:

1. A surface voltage-sustaining structure for lateral semiconductor device which comprises a substrate of a first conductivity type semiconductor material, where the structure is made on the substrate or a thin insulator which is in turn on the substrate; the structure consists of at least two surface voltage-sustaining regions, each is located between two terminals on the surface, one terminal has a voltage of the largest absolute value, another terminal has a voltage of the smallest absolute value, where the voltage is referred to the potential difference to the substrate;

wherein the smallest voltage of the first surface voltage-sustaining region can vary from zero up to the largest voltage and this voltage is called a floating voltage, whereas the largest voltage of the second surface voltage-sustaining region is equal or almost equal to the floating voltage and the smallest voltage of the second surface voltage-sustaining region is zero or close to zero;

the surface voltage-sustaining structure can further have an isolation region with a lateral dimension much smaller than that of the surface voltage-sustaining region; the isolation region(s) is (are) set between two terminals having floating voltage of the first surface voltage-sustaining region and the second surface voltage-sustaining region;

wherein each surface voltage-sustaining region consists of at least a bottom (first) layer of semiconductor of the second conductivity type and a second layer of semiconductor of the first conductivity type; and may have still other layers being arranged in order of number from bottom layer to top, where the layers of odd number are semiconductor of the second conductivity type and the layers of even number are semiconductor of the first conductivity type;

wherein the layers of odd number or at least the first layer are (is) connected directly or through conductors to the terminal having a largest potential; at least one layer of even number are connected directly or through conductor(s) to the terminal having a smallest potential;

wherein the total thickness of each surface voltage-sustaining region is much smaller than the depletion width of a one-sided abrupt junction made by the same substrate under its breakdown voltage;

said largest voltage is positive (or negative) when the substrate is p-type (or n-type) semiconductor;

wherein two neighboring layers of the surface voltage-sustaining region can also be separated by a thin insulator;

wherein the dose of the first layer of the first surface voltage-sustaining region decreases with the lateral distance from the largest voltage terminal, from a value close to but not larger than $2D_0$ to a value close to but smaller than $D_0$ at the smallest voltage terminal;

wherein the dose $D_0$ means the number of the depleted impurities of the semiconductor of the second conductivity type in a unit area of a one-sided abrupt plane junction made by the same substrate;

wherein the dose of the first layer of the second surface voltage-sustaining region decreases with the lateral distance from the largest voltage terminal, from a value not larger than $2D_0$ but not smaller than $D_0$ to a value not larger than $D_0$ at the smallest voltage terminal;

wherein the dose of the last (top) layer of any said surface voltage-sustaining region should be not larger than $D_0$, wherein the dose of any layer besides the first and the last layer should be not larger than $2D_0$ at the place close to the largest voltage terminal, and should be not larger than $1.8D_0$ at the place of the smallest voltage terminal;

wherein an effective density of impurity, referring to the sum of the densities of the layers having odd number subtracted by the sum of the densities of the layers having even number, said effective density decreases gradually or stepwise from a value of $D_0$ at the terminal of the largest voltage to a value of zero at the terminal of the smallest voltage;

wherein the density means the amount of ionized impurities in an area divided by the area, and the dimension of the area in any direction is much smaller than the depletion width of a one-sided abrupt plane junction made by the same substrate under its breakdown voltage;

wherein except the bottom (first) layer, every layer of the surface voltage-sustaining region is almost neutral, when the smallest voltage approaches to the largest voltage.

2. A lateral device using majority carriers in the drift region of claim 1, wherein the drift region(s) of the majority carries is the neutral layer(s) of the semiconductor of the same conductivity type of the majority carriers, the method of injection and/or extraction of the majority carriers into and/or from the drift region is by using an active region of device of the same type of the majority carriers or by using an active region of device of the opposite type of the carriers and transferring such carriers to be the majority carriers of the drift region through a floating ohmic contact; a device using the latter method is called as a pseudo-device of the majority carriers, where a pseudo-nMOST (or a pseudo-pMOST) means the active region is an nMOST (pMOST) but the drift region is p-type (n-type) semiconductor.

3. A LIGBT of claim 1, where a MOST of first conductivity type is made in the area of the largest voltage terminal, the emitter is made of a second conductivity type region which in turn is made in a first conductivity type region in the area of the smallest voltage terminal; the LIGBT can further have an auxiliary MOST of second conductivity type for extracting the carriers of the first conductivity type, where an anode serves as a source of the auxiliary MOST and a drain is made of a region of the second conductivity type which in turn is made in a first conductivity type region and connected through a floating ohmic contact with the first conductivity type region, said auxiliary MOST is made in the area of the smallest voltage terminal.

4. A diode of claim 1, where an anode and a cathode are made on the terminal of the largest potential and on the terminal of the smallest potential of a surface voltage-sustaining region, respectively.

5. A semiconductor device of claim 1, wherein the isolation region from the floating (smallest) voltage terminal of the first surface voltage-sustaining region to the floating (largest) voltage terminal of the second surface voltage-sustaining region is formed by a region of semiconductor of second conductivity type followed by a region of semiconductor of first conductivity type or a region of insulator and then followed by a region of semiconductor of second conductivity type.

6. An isolation region of claim 1, wherein from the terminal having the smallest absolute (floating) voltage of the first surface voltage-sustaining region to the terminal having the largest absolute (floating) voltage of the second surface voltage-sustaining region is a region of semiconductor of second conductivity type which is connected directly to both first (bottom) layers of said both surface voltage-sustaining regions and is separated from the other layers of odd number by regions of semiconductor of first conductivity type; the region of semiconductor of second conductivity type of the isolation region can have a thin insulator layer on its top, the insulator layer in turn can have a conductor as an electrode, the electrode can be connected to a tub.

7. An isolation region of claim 1, wherein from the terminal having the smallest absolute voltage of the first surface voltage-sustaining region to the terminal having the largest absolute voltage of the second surface voltage-sustaining region is a region of a semiconductor of second conductivity type, followed by a region of a semiconductor of first conductivity type, and then followed by a region of a semiconductor of second conductivity type containing low-voltage small size device, and further followed by a region of a semiconductor of first conductivity type, which meet the region of semiconductor of the second conductivity type having the terminal of the largest absolute voltage of the second surface voltage-sustaining region; wherein a low-voltage device is made inside the region of a semiconductor of second conductivity type and taking its voltage as reference, and this reference voltage is made through an outer connection equal to the terminal having the absolute voltage of the first surface voltage-sustaining region; at least one electrode of said low voltage device is connected through an outer connector to the terminal having the voltage of the second surface voltage-sustaining region; thus the smallest voltage of the first surface voltage-sustaining region has a little difference with the largest voltage of the second surface voltage-sustaining region.

8. A device of claim 1, wherein the carriers are the majority carriers of the first conductivity type, the active region controlling the flow of the carriers is made in a region of semiconductor of the second conductivity type having the largest potential, the drift region of the majority carriers are the layers having even number(s) in the surface voltage-sustaining region, the drain electrode of the majority carriers is made in direct contact to at least one layer of even number at the terminal having smallest voltage.

9. A device of claim 1, wherein the carriers are the majority carriers of the second conductivity type, the active region controlling the flow of the carriers is made in a region of semiconductor of the first conductivity type, contacted at least one of the layer of even number around the terminal of the smallest voltage, whereas the drift region is the layer of odd number, and the drain is made in a region of semiconductor of the second conductivity type which contacts at least the first layer of the layers of odd number at the terminal having the largest voltage.

10. A transmission gate made of a parallel connection of two devices according to claim 8, wherein the majority carriers of one device carriers of the first conductivity type and the majority carriers of the other device are carriers of the second conductivity type, the drain of one device is connected to the source of the other device and vice versa.

11. A low voltage device according to the surface voltage-sustaining region of claim 1, wherein the reference of the low voltage device is the largest voltage and the low voltage device is formed in a region of semiconductor of the second conductivity type which is connected directly with the first layer of the surface voltage-sustaining region at the place having the largest voltage.

12. A low voltage device according to the surface voltage-sustaining region of claim 1, wherein the reference of the low voltage device has a little difference with the largest voltage and the low voltage device is formed in a region of semiconductor of the first conductivity type, which in turn is in a region of semiconductor of the second conductivity type having the largest voltage and contacting with the first layer in the surface voltage-sustaining region.

* * * * *